US009401379B2

(12) United States Patent
Rohde et al.

(10) Patent No.: US 9,401,379 B2
(45) Date of Patent: Jul. 26, 2016

(54) IMAGE SENSOR MODULE AND METHOD FOR PRODUCING SUCH A MODULE

(75) Inventors: Hartmut Rohde, Waltenhofen (DE); Ulrich Seger, Leonberg-Warmbronn (DE); Thomas Kurzweil, Weitnau (DE); Uwe Apel, Neckartailfingen (DE); Marc Zimmermann, Sonthofen (DE); Anja Beckerle, Memmingen (DE); Klaus Zeh, Unterthingau (DE); Gerald Brinks, Waltenhofen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 173 days.

(21) Appl. No.: 14/004,632

(22) PCT Filed: Jan. 16, 2012

(86) PCT No.: PCT/EP2012/050565
§ 371 (c)(1),
(2), (4) Date: Nov. 18, 2013

(87) PCT Pub. No.: WO2012/123142
PCT Pub. Date: Sep. 20, 2012

(65) Prior Publication Data
US 2014/0061438 A1 Mar. 6, 2014

(30) Foreign Application Priority Data

Mar. 16, 2011 (DE) .......................... 10 2011 005 629

(51) Int. Cl.
*H01L 27/00* (2006.01)
*H01L 27/146* (2006.01)
*H04N 5/225* (2006.01)
(Continued)

(52) U.S. Cl.
CPC .......... *H01L 27/14618* (2013.01); *B60R 11/04* (2013.01); *H01L 27/14683* (2013.01); *H04N 5/2251* (2013.01); *H04N 5/2257* (2013.01); *B60R 2011/0026* (2013.01); *H01L 2224/16* (2013.01)

(58) Field of Classification Search
CPC ........................ H04N 5/2251; H04N 5/2252
USPC ...................................................... 250/239
See application file for complete search history.

(56) References Cited

U.S. PATENT DOCUMENTS 5,703,352 A * 12/1997 Snoeren et al. ............ 250/208.1
7,795,577 B2 9/2010 Olsen et al.
(Continued)

FOREIGN PATENT DOCUMENTS

DE 196 51 260 1/1998
JP H04247421 A 9/1992
(Continued)

OTHER PUBLICATIONS

International Search Report for PCT/EP2012/050565, dated May 10, 2012.

*Primary Examiner* — Thanh Luu
(74) *Attorney, Agent, or Firm* — Norton Rose Fulbright US LLP

(57) ABSTRACT

An image sensor module includes an image sensor bearer and an image sensor, the image sensor bearer being fashioned as an injection-molded circuit bearer, and the image sensor being situated on the image sensor bearer, and the image sensor bearer including at least one holding device that is integrally formed on the image sensor bearer.

17 Claims, 4 Drawing Sheets

(51) Int. Cl.
*B60R 11/04* (2006.01)
*B60R 11/00* (2006.01)

(56) References Cited

U.S. PATENT DOCUMENTS

| | | | |
|---|---|---|---|
| 2006/0186317 A1* | 8/2006 | Farnworth et al. | 250/208.1 |
| 2008/0135728 A1 | 6/2008 | Yang et al. | |
| 2009/0095893 A1 | 4/2009 | Strum | |
| 2010/0085474 A1 | 4/2010 | Morita | |
| 2010/0141825 A1 | 6/2010 | Kim et al. | |
| 2010/0194974 A1* | 8/2010 | Hoshikawa | 348/373 |
| 2010/0297799 A1 | 11/2010 | Gagnard | |
| 2010/0328525 A1* | 12/2010 | Lee | H01L 27/14618 348/374 |
| 2011/0050989 A1 | 3/2011 | Kim et al. | |

FOREIGN PATENT DOCUMENTS

| | | |
|---|---|---|
| JP | H0996749 | 4/1997 |
| JP | 2001333332 | 11/2001 |
| JP | 3105066 U | 10/2004 |
| JP | 2007043628 A | 2/2007 |

* cited by examiner

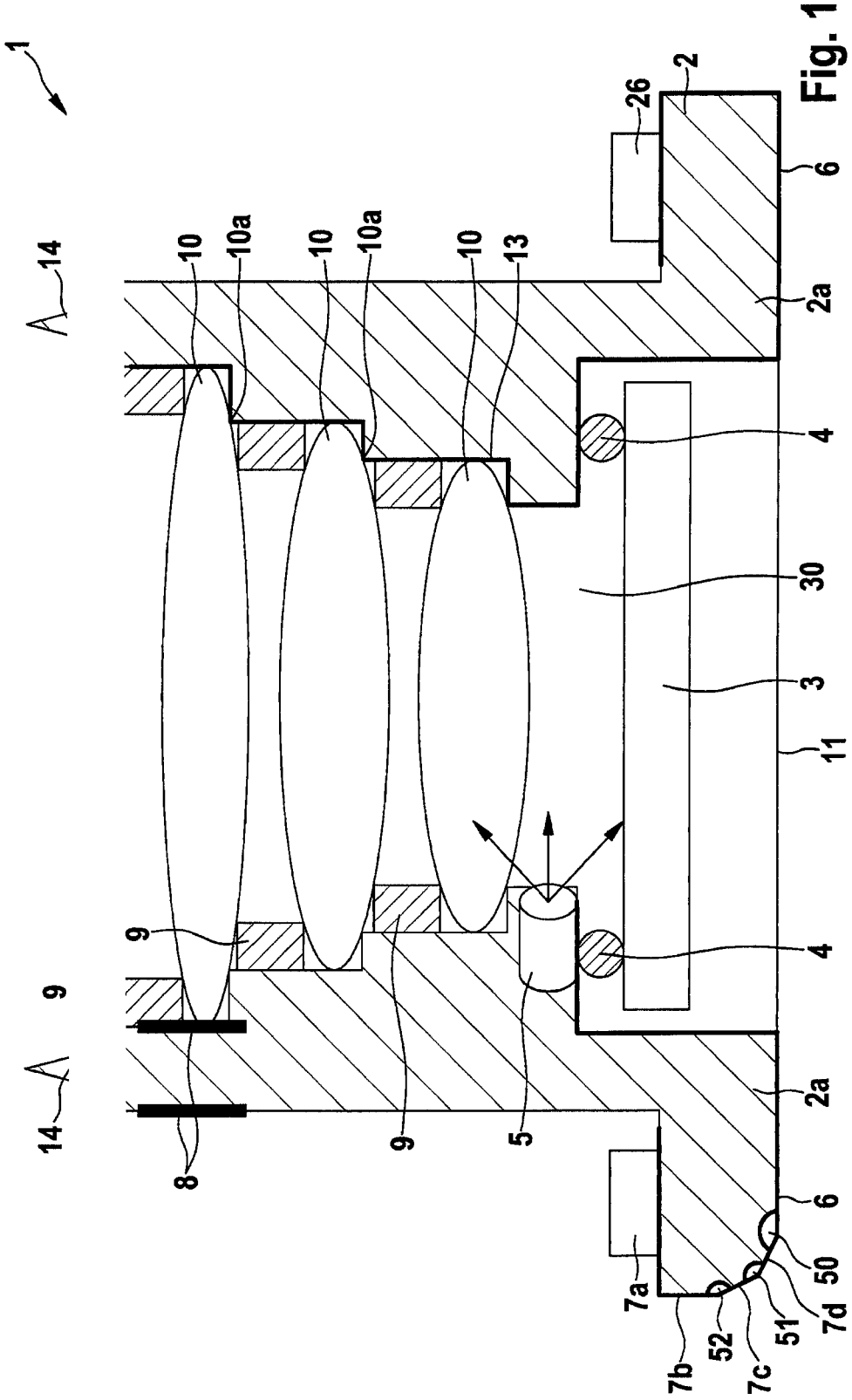

IMAGE SENSOR MODULE AND METHOD FOR PRODUCING SUCH A MODULE

BACKGROUND OF THE INVENTION

1. Field of the Invention

The present invention relates to an image sensor module and to a method for producing an image sensor module. The present invention also relates to a use of an image sensor module.

2. Description of the Related Art

Image sensor modules, or imager modules, i.e. a combination of an image sensor with an imaging optical system, a lens holder, a chip bearer, and electrical terminals, have many commercial applications. Such imager modules are used as cameras in mobile telephones, or, in the area of automotive engineering, are used in driver assistance systems, e.g. as a high-beam headlight assistance system or the like.

For the production of an above-named imager module, the individual parts of the imaging optical system, for example the lenses, the lens holders, the lens mounts for connecting the imaging optical system to a bearer of the image sensor, sealing elements, bearers for an image sensor, and a corresponding housing, are bonded to one another by soldering, gluing, or by some other construction and connection technology.

In order to make it possible to determine the position of the components relative to one another with sufficient precision, the imaging optical system and the image sensor are each operated actively, and are then brought into a desired position relative to one another and fixed during operation.

From published U.S. patent application document US 2010/0297799 A1, a method is known for producing an image recording device. First, a first wafer is produced that has image sensors on a first surface in active regions. The active regions are separated from one another by separating regions. The active regions here include metallic connections that extend into the wafer perpendicularly from the active regions. In further steps, walls are then situated essentially symmetrically to the metallic contactings, perpendicular to the first surface. Between the walls, a substantially open space is provided. On the upper side of the two adjacent walls, there is glued a plate having a lens element. The entire unit is glued to a circuit board, so that the metallic contacting of the active region is connected to electrical contacts of the circuit board via a solder point.

From published German patent application document DE 196 51 260 A1, an image sensor chip and a corresponding bearer element are known. The image sensor chip has a bearer element that is a component of a housing of a camera that, apart from the image sensor chip, also contains further integrated circuits. The printed conductors of the bearer element are produced using molded interconnect device technology, in particular using a hot stamping method.

From U.S. Pat. No. 7,795,577 B2, an image sensor module is known. The image sensor module includes, lateral to the image sensor, lens holders that are fashioned as side walls. The image sensor also includes, apart from the lens holders, contact points to its electrical contacting. Overall, three lenses are situated above the image sensor in the lens mount.

From published U.S. patent application document US 2009/0095893 A1, a further image sensor module is known. The image sensor module includes a lower glass layer that is situated on a wiring layer. Above the lower glass layer there is situated a silicon core that has an image sensor. On the silicon layer there is situated an upper glass layer, and above this there is situated a lens mount that includes an optical component.

BRIEF SUMMARY OF THE INVENTION

An image sensor module is defined that includes an image sensor bearer and an image sensor, the image sensor bearer being fashioned as an injection-molded circuit bearer, and the image sensor being situated on the image sensor bearer, and the image sensor bearer including at least one holding device that is integrally formed on the image sensor bearer.

A method for producing an image sensor module includes the steps: production of an image sensor bearer by injection molding and situation of an image sensor on the image sensor bearer, a holding device being integrally formed on the image sensor bearer.

A use of an image sensor module in a camera, in particular in a camera of a mobile telephone or in a camera of a motor vehicle is provided.

One of the advantages achieved by the present invention is that an expensive positional fixing of the imaging optical system relative to the image sensor can be omitted, i.e. the invention includes a self-adjusting characteristic. This makes the production of such an image sensor module significantly easier. At the same time, the time required for production of such an image sensor module is reduced, because time-consuming and expensive "active alignment" processes, compensating the tolerances of individual components from previous production steps, can be omitted. In addition, the use of material, for example auxiliary media such as glue or the like, is also reduced. Overall, the failure rate in the production of such an image sensor module is also reduced, because the chain of production steps is shorter and less susceptible to disturbance.

According to an advantageous development of the present invention, the imaging optical system includes at least one lens. The essential advantage of this is that simple assembly and simple focusing of light on the image sensor are enabled.

According to a further advantageous development of the present invention, at least two holding devices are fashioned as a mount for each lens, and the two holding devices are situated one over the other in stepped fashion. The advantage achieved thereby is that in this way the lenses can easily be placed into the holding device, for example laterally. As long as the lenses are not already shaped in such a way that direct placement or stacking one over the other of the lenses is possible, spacing elements can usefully be situated between the lenses, in particular so-called spacers and/or retainer rings. These can for example be laid in place, integrally formed thermally, glued in, or screwed in.

According to a further advantageous development of the present invention, the image sensor bearer includes conductive, in particular metallic, regions for contacting electric components. The advantage achieved thereby is that in this way electrically passive and/or active components can be easily and reliably situated on the surface of the image sensor bearer, for example by conductive gluing, soldering, bonding, or the like. Thus, using the metallic regions a conductive connection can be achieved for the wiring of electronic components situated on the surface of the image sensor bearer. An image sensor bearer produced using MID technology thus enables a simple and reliable possibility for situating electronic components on the image sensor bearer and electrically contacting them in order to provide an image sensor module.

According to a further advantageous development of the present invention, the image sensor is connected to at least one metallic region of the image sensor bearer via at least one electrically conductive connection for electrical contacting. The advantage achieved thereby is that in this way a space-saving and reliable contacting of the image sensor is enabled.

According to a further advantageous development, the image sensor module includes at least one seal for protection from dust and the like. The advantage achieved thereby is that in this way an influencing of the image quality by dust particles in intermediate spaces that may exist in the imaging optical system, and also in the intermediate space between the imaging optical system and the image sensor, is avoided. Usefully, the seal can be produced by forming thermally deformable edges of the image sensor bearer. After thermally plastic deformation of the corresponding region of the image sensor, the thermally deformable edges are then for example situated fixedly on the edge of the lenses, and thus take over the function both of a lens mount and of a corresponding sealing of intermediate spaces in order to protect against dust and the like.

According to a further advantageous development of the present invention, the at least one holding device and/or the seal can be produced through thermal and/or mechanical plastic deformation. In this way, an economical production of the holding device and/or of the seal is possible.

Usefully, the, image sensor module can also include an equalizing element. The advantage of this is that the image sensor module is then not mechanically stressed due to the volume of air enclosed in the image sensor module, even in the case of pressure fluctuations due for example to thermal loading of the image sensor module. Here it is particularly useful to form the pressure-equalizing element as a membrane, and in particular to form the surface of the membrane as the image sensor module identifying surface. This can for example be achieved by situating a label on the rear side of the image sensor module for sealing an intermediate space of the image sensor module against the surrounding environment. The label can be provided with a data matrix code, for example for reasons of production.

According to a further advantageous development of the present invention, at least one region of the image sensor module is fashioned as an adjustment aid, in particular as a pin. The advantage thereby achieved is that in this way the relative position of the image sensor module in a mount that is to be received, for example a pane mount, can be determined particularly easily and precisely. Here it is particularly advantageous if the adjustment aid is fashioned such that, using it a three-point support determines the relative position of the image sensor module in the mount, in a tip-proof manner. It is particularly useful here if the system has at least two adjustment aids having the greatest possible distance from one another, in order to minimize tolerances in the position of the image sensor module in the mount.

According to a further advantageous development of the present invention, at least one heating device, in particular a thermoelectric layer, is provided in order to temper the image sensor module. At cold temperatures, it is possible that moisture may be deposited on the image sensor module. If a heating device is provided, it is possible to operate the image sensor module in a larger temperature range, because a deposition of moisture is at least significantly reduced. If the image sensor module is heated for example in the case of cold starts, for example given use of the image sensor module in a vehicle, this results in a reduced tendency to condensation on the surfaces of the imaging optical system of the image sensor module. Here, the at least one heating element is usefully formed on a surface, in particular an inner surface, of the image sensor bearer. This further reduces a tendency to condensation in the image sensor module at low temperatures. It can be particularly advantageous here to heat the image sensor module to only slightly above the ambient temperature, which is energy-efficient. In addition, this prolongs the useful life of the image sensor module, because given a heating of the image sensor module at low temperatures, larger maximum temperature differences, and therefore tolerances due to temperature, are avoided, and in particular a reduction of the temperature stress during running operation is enabled.

According to further advantageous development of the method, the image sensor bearer is produced in one piece. This enables an economical use of material, as well as a high degree of ease of assembly and robustness of the image sensor bearer.

Advantageously, further sensors can be situated in the image sensor module. Possible sensors here are temperature sensors, moisture sensors, and capacitance sensors, or the like. The advantage achieved thereby is that in this way a precise acquisition of the temperature at the imaging optical system and at the image sensor, as well as a capacitive coating on walls of the image sensor module, or moistness in the imaging optical system, is enabled. In addition, an efficient and cost-effective controlling of the heating device of the image sensor module is also enabled.

In addition, at least one light source, in particular in the form of a light-emitting diode, can also advantageously be situated in the image sensor module. The advantage achieved thereby is that in this way a simple and coat-effective monitoring of the function of the image sensor module is enabled, in that correlated light stimuli and evaluation of the corresponding stimuli by the image sensor are enabled.

In addition, it is useful to situate bonding pads on the image sensor module. The advantage achieved thereby is that in this way a space-saving wired connection is enabled between the image sensor module and a circuit board. Particularly advantageously, the bonding pads are situated on an end surface of the image sensor module. In addition, it is particularly useful that the bonding pads can also, alternatively or in addition, be oriented on bevels of the image sensor module, which are made in a plurality of spatial directions,. Thus, for example a standardly rectangular edge can be made polygonal, and can thus enable an orientation of bonding pads in different spatial directions. This further simplifies the contacting of the image sensor module.

In addition, it is advantageous for at least one testing device to be situated on the image sensor module. Here it is particularly advantageous if the testing device is situated at an easily accessible location, in particular on a surface of the image sensor module. The advantage achieved thereby is that a simple and reliable monitoring of the functioning of the image sensor module is enabled. Flexible or other cable connections, which require a high mechanical outlay, can in this way be omitted. The testing device can usefully be realized as a testing point, so that for example a simple contacting by a functional circuit tester is enabled.

BRIEF DESCRIPTION OF THE DRAWINGS

FIG. 1 schematically shows an image sensor module according to a first specific embodiment of the present invention, in cross-section.

DETAILED DESCRIPTION OF THE INVENTION

Figure 2A:
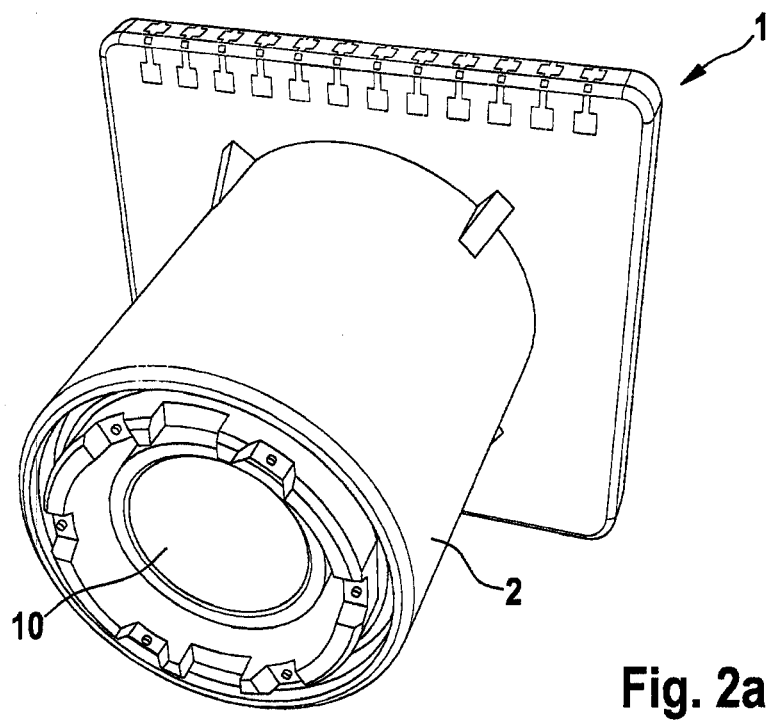
FIGS. 2a, 2b show an image sensor module according to FIG. 1 in a three-dimensional schematic view.

In the Figures, identical reference characters designate the same, or functionally identical, elements.

FIG. 1 schematically shows an image sensor module according to a first specific embodiment of the present invention, in cross-section.

In FIG. 1, reference character 1 designates an image sensor module. Image sensor module 1 has an image sensor bearer 2 having, in the cross-section in FIG. 1, an intermediate space 30. The internal walls of intermediate space 30 are fashioned symmetrically to one another and substantially step-shaped. In the lower region of image sensor bearer 2, via contacts 4 at the left and at the right an image sensor 3 is electrically contacted with a wiring layer 6 on the surface of the image sensor bearer. Above left contact 4 there is situated a light source 5 that radiates light into intermediate space 30. Further above image sensor 3, in the stepped areas three lenses 10 are situated one over the other and parallel to one another, each being situated in a corresponding lens seat 9. Each lens seat 9 is connected to image sensor bearer 2 and is fashioned in one piece with image sensor bearer 2. In the region of uppermost lens 10, a moisture sensor 8 is situated of the left side on image sensor bearer 2. On the upper side of image sensor bearer 2, in FIG. 1 at the left and at the right there is situated a respective adjusting pin 14 oriented perpendicularly upward. On the right inner side of intermediate space 30 on image sensor bearer 2, there is situated a heating element in the form of a resistance structure 13. It is situated not only on the right side of the inner surface of intermediate space 30 on image sensor bearer 2, but likewise on the right side in the lower region of image sensor bearer 2.

Image sensor bearer 2 has a respective projection 2a at its left side, oriented to the left, and on its right side, oriented to the right. Projection 2a is essentially provided with the above-named wiring layer 6, on its outer side and on the left inner side of intermediate space 30, and contacts both light source 5 and, via contact points 4, image sensor 3. In addition, on the left outer side of wiring layer 6, in the region of left projection 2a there is situated a contact point 7b by which image sensor module 1 can be contacted for testing purposes. Perpendicular thereto, on the upper side of projection 2a, there is provided a contacting point 7a for bonds, used substantially for contacting image sensor module 1.

Underneath contacting point 7b, the lower edge of left projection 2a is made polygonal in its cross-section; the transition between the edge, which is perpendicular in FIG. 1, of projection 2a with contacting point 7b and the adjacent horizontally situated floor surface of projection 2a does not take place at an interior angle 50, 51, 52 of 90°, but rather at angles of in each case more than 90°, so that in addition further contacting points 7c, 7d are in each case formed on a surface segment. In this way, the contacting of image sensor module 1 is significantly simplified. On the upper side of right projection 2a, an electrical component 26 is situated on wiring layer 6. Image sensor 3 is in each case sealed airtight in the upper region by the respective lens seat 10a. In the lower region, for protection against dust there is situated a film 11, in particular a pressure-equalizing film, which can be provided with a label for the identification of image sensor module 1.

FIG. 2 shows an image sensor module according to FIG. 1, in a three-dimensional schematic view.

Figure 2B:
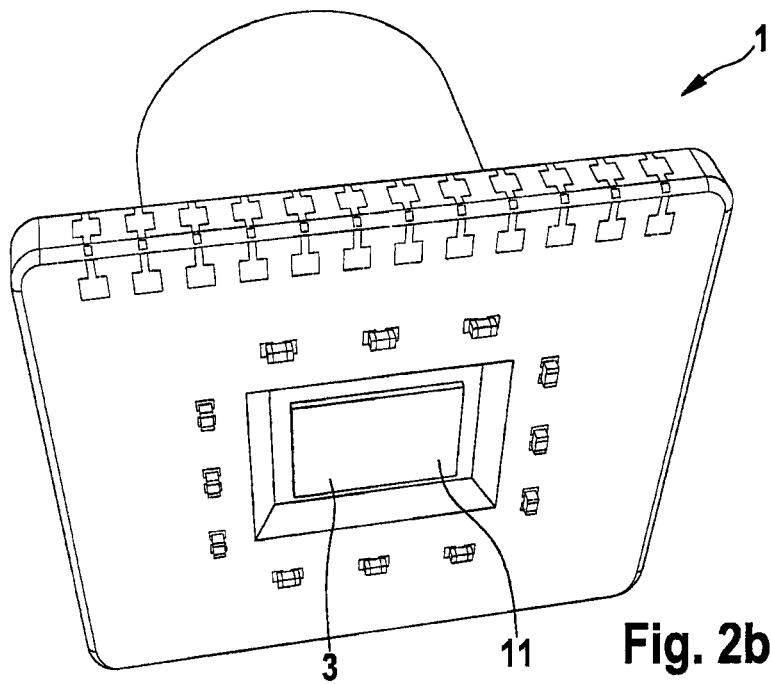

FIG. 2a shows an image sensor module 1 in a three-dimensional view from the front. In particular, lens 10 and image sensor bearer 2 can be seen in FIG. 2. The image sensor bearer is essentially cylindrical. In FIG. 2b, the rear side of image sensor module 1 is shown in a substantially three-dimensional view. From below, film 11 can be seen, which acts as dust protection for image sensor 3, and which can be provided with a label for identifying image sensor module 1.

Figure 3:
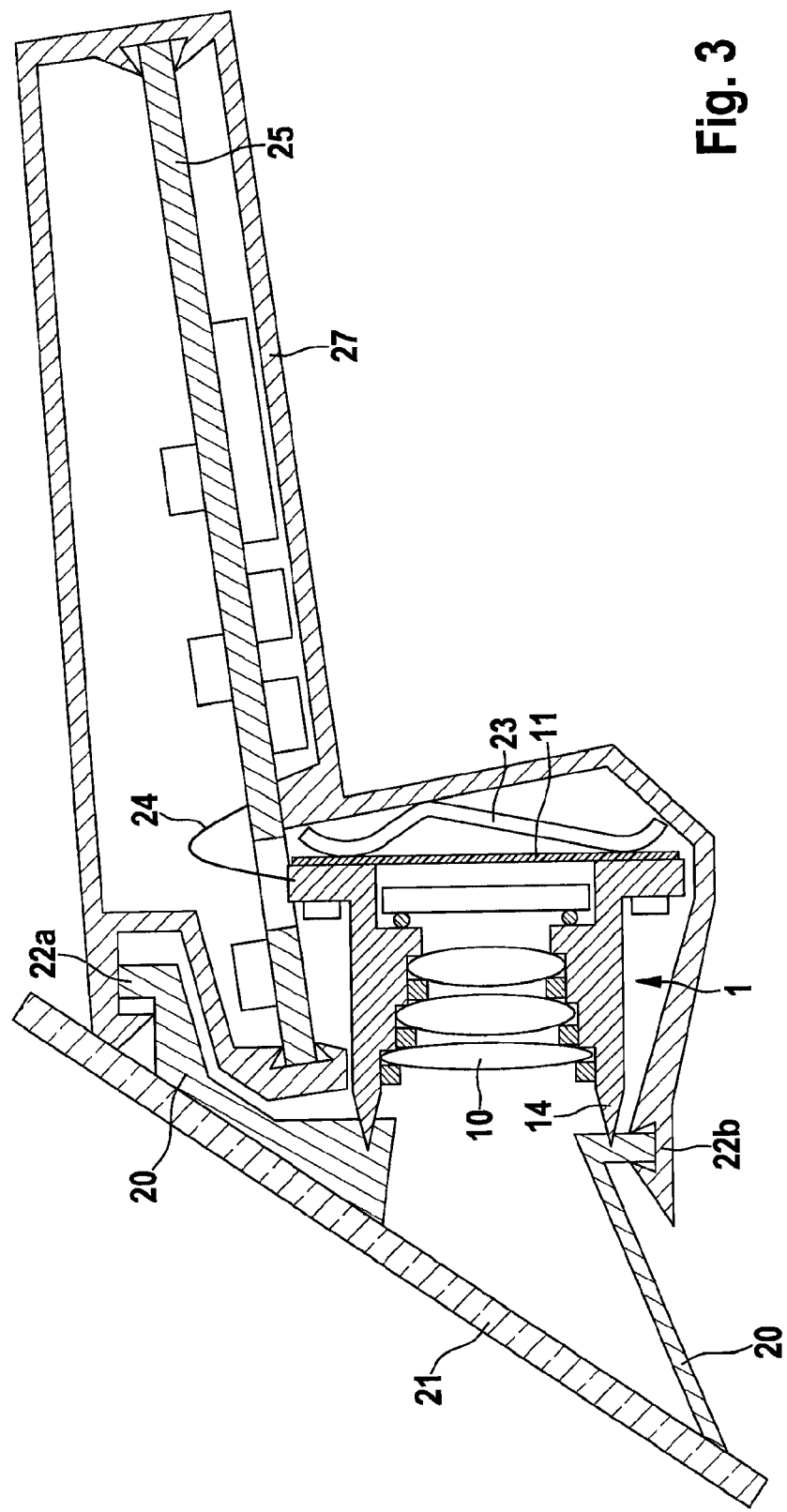
FIG. 3 schematically shows a pane mount with an image sensor module as shown in FIG. 1.

FIG. 3 schematically shows a pane mount having an image sensor module as shown in FIG. 1.

FIG. 3 shows a pane that in FIG. 3 runs essentially from the lower left toward the upper right at an angle of approximately 50°. Pane 21 can for example be fashioned as a windshield of a motor vehicle. On the right side of pane 3, there are situated pane mounts 20. Via upper and lower locking connections 22a, 22b, a camera housing 27 is clipped into pane mounts 20. A main circuit board 25 is situated in the upper region in camera housing 27. Image sensor module 1 is situated in camera housing 27 so as to be essentially rotated by 90° counterclockwise relative to the representation shown in FIG. 1, so that light can impinge on it through oblique pane 21, for example light from the headlamps of an oncoming motor vehicle. On the rear side of image sensor module 1, i.e. in the region of film 11, image sensor module 1 is pressed by a retaining spring 23 into correspondingly shaped recesses of pane mount 20 for adjustment pins 14, so that image sensor module 1 is held in camera housing 27 by spring 23. Wire bonds 24 connect main circuit board 25 to contacting points of image sensor module 1 for the electrical contacting.

It is also possible to connect camera housing 27 to pane mount 20 via glued connections, clamped connections, or screwed connections. The position and orientation of image sensor module 1 is here determined by a three-point seating. However, seatings having four or more points are also conceivable.

Figure 4:
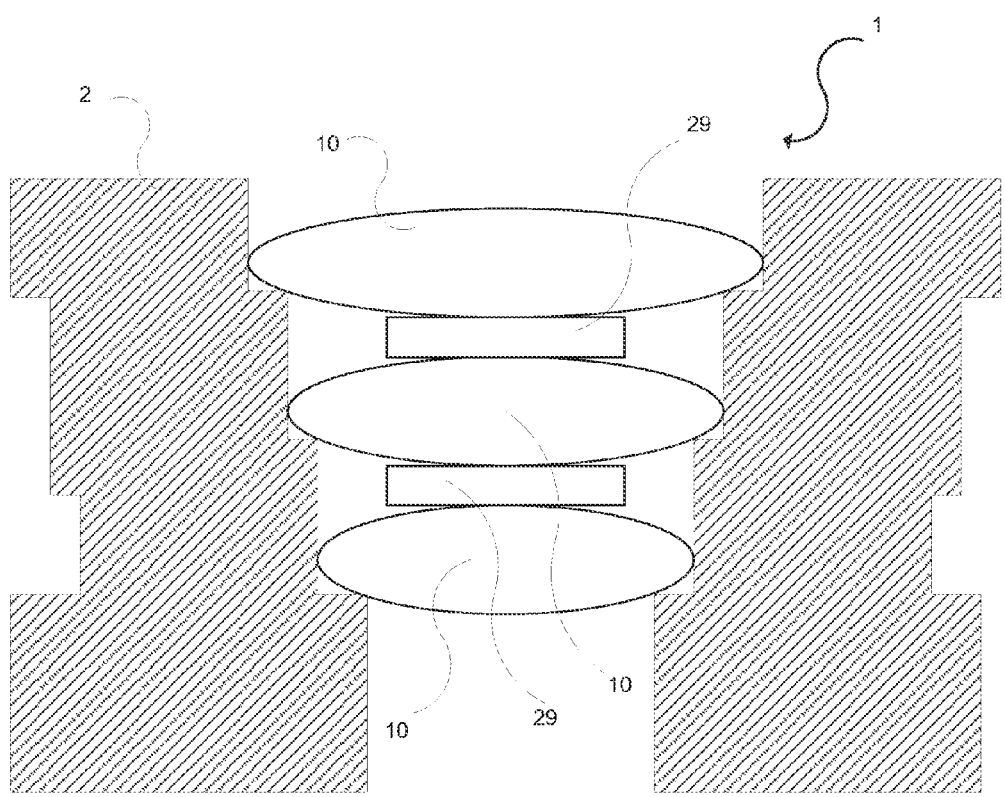
FIG. 4 shows the relationship between the spacing elements and the lenses in an image sensor module.

FIG. 4 shows the relationship between the spacing elements and the lenses in an image sensor module.

FIG. 4 shows an image sensor module 1 having an imaging sensor bearing 2. The image sensor bearer includes three lenses 10 that are situated one over the other and parallel to one another. Spacing elements 29 are placed between the lenses. In some embodiments, the spacing elements are spacers and/or retainer rings.

Although the present invention has been described above on the basis of preferred exemplary embodiments, it is not limited thereto, but rather can be modified in many ways.

Thus, for example it is possible to use image sensor module 1 not only in driver assistance systems, but also in consumer products such as mobile telephones, etc.

In sum, the present invention has the advantage that it makes it possible to significantly reduce the expense for the production of an image sensor module. At the same time, production is simpler, and the image sensor module is robust against environmental influences, in particular against dust and changes in temperature. In addition, the production process is also shorter in time, and the rejection rate is low.

What is claimed is:

1. An image sensor module, comprising:
   an image sensor bearer configured as an injection-molded circuit bearer;
   an image sensor situated on the image sensor bearer; and
   an imaging optical system that includes at least two lenses,
   wherein the image sensor bearer has a stepped interior surface to bear each of the at least two lenses and:
      includes at least two holding devices for the imaging optical system,
      is provided as respective mounts that supports the corresponding lenses in two directions parallel to a major plane of the image sensor, and
   wherein the at least two holding devices are provided as respective mounts that support the corresponding lenses in two directions, each direction perpendicular to the major plane of the image sensor, are integrally formed on the image sensor bearer, and are situated one over the other in stepped fashion via the stepped interior surface of the image sensor bearer.

2. The image sensor module as recited in claim 1, wherein the image sensor bearer includes conductive regions for electrical contacting of electrical components.

3. The image sensor module as recited in claim 2, wherein the image sensor is connected to the conductive regions of the image sensor bearer via at least one electrically conductive connection for the electrical contacting.

4. The image sensor module as recited in claim 2, further comprising:
at least one seal for protection against external particles.

5. The image sensor module as recited in claim 3, wherein at least one region of the image sensor module is configured as an adjustment aid in the form of a pin.

6. The image sensor module as recited in claim 3, wherein at least one heating device in the form of a thermoelectric layer is situated for tempering of the image sensor module.

7. A method for producing an image sensor module, comprising:
providing an imaging optical system that includes at least two lenses;
producing an image sensor bearer by injection molding, at least two holding devices being integrally formed on the image sensor bearer, wherein the at least two holding devices are configured to hold the imaging optical system; and
providing an image sensor on the image sensor bearer,
wherein the image sensor bearer supports the corresponding lenses in two directions parallel to a major plane of the image sensor,
wherein the image sensor bearer has a stepped interior surface to bear each of the at least two lenses, and
wherein the at least two holding devices are provided as respective mounts that supports the corresponding lenses in two directions perpendicular to the major plane of the image sensor, and situated one over the other in stepped fashion via the stepped interior surface of the image sensor bearer.

8. The method as recited in claim 7, wherein the image sensor bearer is produced in one piece.

9. An image sensor module, comprising:
an image sensor bearer configured as an injection-molded circuit bearer;
an image sensor situated on the image sensor bearer; and
an imaging optical system that includes at least two lenses;
wherein the image sensor bearer includes at least two holding devices for the imaging optical system, and wherein the at least two holding devices are integrally formed on the image sensor bearer,
wherein the at least two holding devices are provided as respective mounts that are in contact with corresponding lenses,
wherein the image sensor bearer has a stepped interior surface to bear each of the at least two lenses, and
wherein the at least two holding devices are situated one over the other in stepped fashion via the stepped interior surface of the image sensor bearer, and
wherein spacing elements are placed between the lenses.

10. An image sensor module, comprising:
an image sensor bearer configured as an injection-molded circuit bearer;
an image sensor situated on the image sensor bearer; and
an imaging optical system that includes at least two lenses; and
at least one seal for protection against external particles;
wherein the image sensor bearer:
includes at least two holding devices for the imaging optical system,
is provided as respective mounts that supports the corresponding lenses in two directions parallel to a major plane of the image sensor, and
wherein the at least two holding devices are provided as respective mounts that support the corresponding lenses in two directions, each direction perpendicular to the major plane of the image sensor, are integrally formed on the image sensor bearer, and are situated one over the other in stepped fashion,
wherein the image sensor bearer includes conductive regions for electrical contacting of electrical components, and
wherein the holding device is configured as a plastic deformation of the image sensor bearer.

11. An image sensor module, comprising:
an image sensor bearer configured as an injection-molded circuit bearer;
an image sensor situated on the image sensor bearer;
an imaging optical system that includes at least two lenses; and
at least one light source located between the imaging optical system and the image sensor;
wherein the image sensor bearer includes at least two holding devices for the imaging optical system, and wherein the at least two holding devices are integrally formed on the image sensor bearer,
wherein the at least two holding devices are provided as respective mounts that are in contact with corresponding lenses, and
wherein the at least two holding devices are situated one over the other in stepped fashion.

12. The image sensor module as recited in claim 11, wherein the image sensor bearer includes conductive regions for electrical contacting of electrical components.

13. The image sensor module as recited in claim 12, wherein the image sensor is connected to the conductive regions of the image sensor bearer via at least one electrically conductive connection for the electrical contacting.

14. The image sensor module as recited in claim 12, further comprising:
at least one seal for protection against external particles.

15. The image sensor module as recited in claim 14, wherein the holding device is configured as a plastic deformation of the image sensor bearer.

16. The image sensor module as recited in claim 13, wherein at least one region of the image sensor module is configured as an adjustment aid in the form of a pin.

17. The image sensor module as recited in claim 13, wherein at least one heating device in the form of a thermoelectric layer is situated for tempering of the image sensor module.

* * * * *